(12) United States Patent  (10) Patent No.: US 7,675,792 B2
Bedeschi et al.  (45) Date of Patent: Mar. 9, 2010

(54) GENERATING REFERENCE CURRENTS COMPENSATED FOR PROCESS VARIATION IN NON-VOLATILE MEMORIES

(75) Inventors: Ferdinando Bedeschi, Milan (IT); Claudio Resta, Pavia (IT); Enzo Donze, Brianza (IT)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 11/904,071

(22) Filed: Sep. 26, 2007

(65) Prior Publication Data

US 2009/0080267 A1  Mar. 26, 2009

(51) Int. Cl.
 *G11C 5/14* (2006.01)
(52) U.S. Cl. .............................. 365/189.09; 365/185.2; 365/185.22
(58) Field of Classification Search ............ 365/189.09, 365/185.2, 185.22, 189.03, 185.18, 210, 365/226
See application file for complete search history.

(56) References Cited

U.S. PATENT DOCUMENTS 6,329,804 B1 * 12/2001 Mercer ........................ 323/315
6,396,729 B1 * 5/2002 Norman et al. ................ 365/63
7,417,900 B2 * 8/2008 Rolandi et al. ......... 365/185.25
2006/0158948 A1 * 7/2006 Fuji ........................... 365/222
2007/0140003 A1 * 6/2007 Ido ........................ 365/185.2
2008/0012596 A1 * 1/2008 Lewison et al. ............. 324/765
2008/0043537 A1 * 2/2008 Tanikawa et al. ....... 365/185.23
2008/0136381 A1 * 6/2008 Yang et al. .................. 323/220

* cited by examiner

*Primary Examiner*—Dang T Nguyen
(74) *Attorney, Agent, or Firm*—Trop, Pruner & Hu, P.C.

(57) ABSTRACT

In a current reference generator device, a voltage reference generator stage generates a reference voltage ($V_{ref}$) and an active element output stage receives the reference voltage ($V_{ref}$) and outputs a reference current ($I_{ref}$) as a function of the reference voltage ($V_{ref}$). A control stage is operatively coupled to the voltage reference generator stage and to the active element output stage and controls a first trimmable parameter (m) associated to the voltage reference generator stage and a second trimmable parameter associated to the active element output stage, so as to compensate for changes in a value of the reference current ($I_{ref}$) due to manufacturing process deviations.

30 Claims, 3 Drawing Sheets

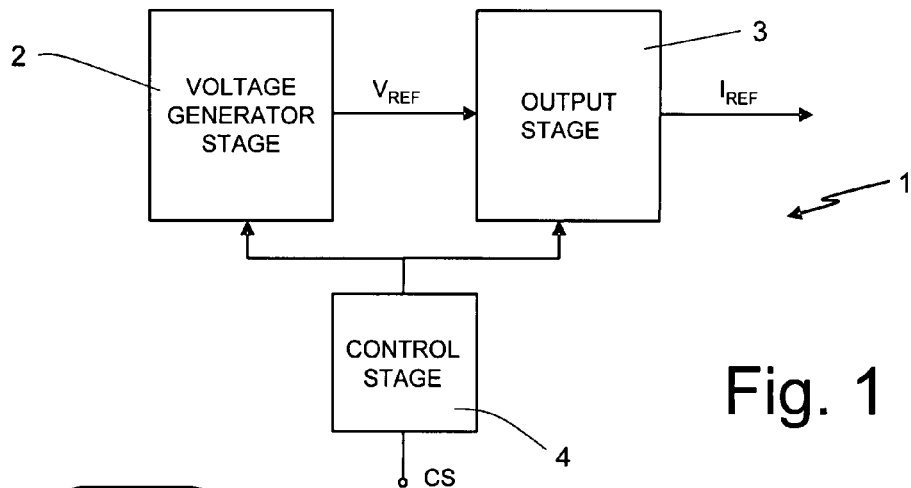
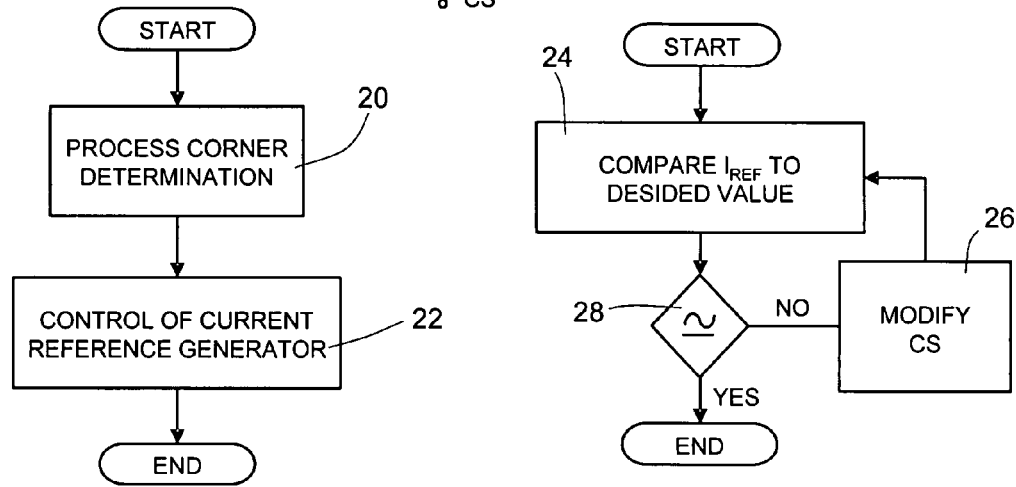
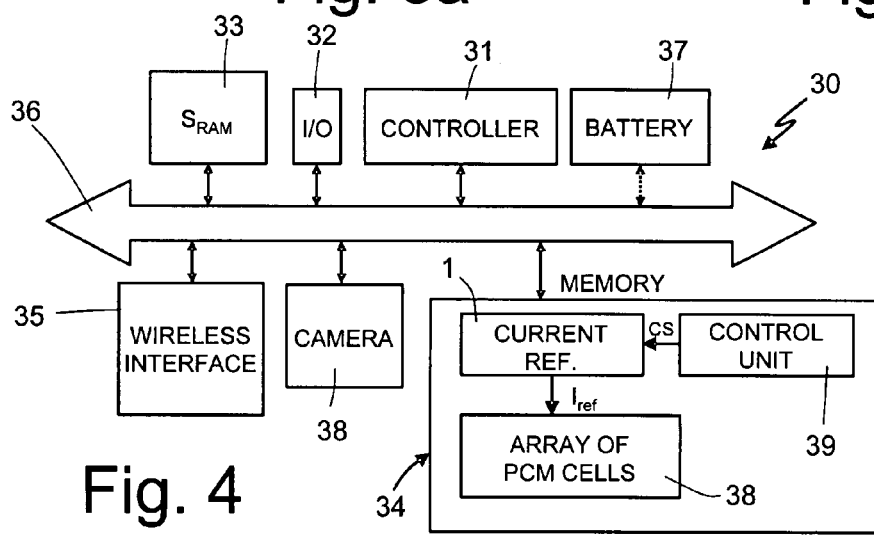

GENERATING REFERENCE CURRENTS COMPENSATED FOR PROCESS VARIATION IN NON-VOLATILE MEMORIES

BACKGROUND

This relates generally to a trimmable (or adjustable) current reference generator for semiconductor non-volatile memories.

In order to ensure repeatability of memory operations, current references are generally employed having a high degree of stability, in particular with respect to changes of temperature or supply voltage (Vcc).

Known current reference generators envisage the use of a bandgap voltage reference generator coupled to an active element, like a MOS transistor. As is known, bandgap voltage references create a very stable reference voltage with respect to both temperature and power supply variations; this reference voltage is used to drive the active element, which in turn generates a corresponding reference current.

Accordingly, the reference current $I_{ref}$ generated by the current reference generator (whose value can be controlled through the electrical parameters of the output active element) will exhibit substantially the same stability with respect to temperature and power supply variations as the bandgap reference voltage $V_{ref}$.

However, as is well known in the art, manufacturing processes in the semiconductor industry are subject to stochastic errors, causing a real process to differ from an ideal or target process. In particular, real processes distribute according to a Gaussian pattern around a target process. A key parameter used to characterize manufacturing processes is the switching speed of the resulting electrical components/devices, based on which a given process can be classified according to so called "process corners" (e.g. "fast", "slow" or "typical" process corners).

In the above described current reference generator, the generated reference current is not invariant with respect to deviations in the manufacturing process (so called "process skews"). As a result, current reference generators having different electrical properties usually result from a same manufacturing process, due to inherent variations in the process parameters among the various manufactured batches (having different process corners).

BRIEF DESCRIPTION OF THE DRAWINGS

For the understanding of the present invention, preferred embodiments thereof are now described, purely by way of non-limiting examples, with reference to the enclosed drawings, wherein:

FIG. 1 is a schematic block diagram of a current reference generator according to an aspect of the invention;

FIGS. 3a, 3b show flow charts of control operations in the current reference generator of FIG. 1;

FIG. 4 shows a schematic block diagram of an electronic system in accordance with an aspect of the present invention.

DETAILED DESCRIPTION

Figure 2:
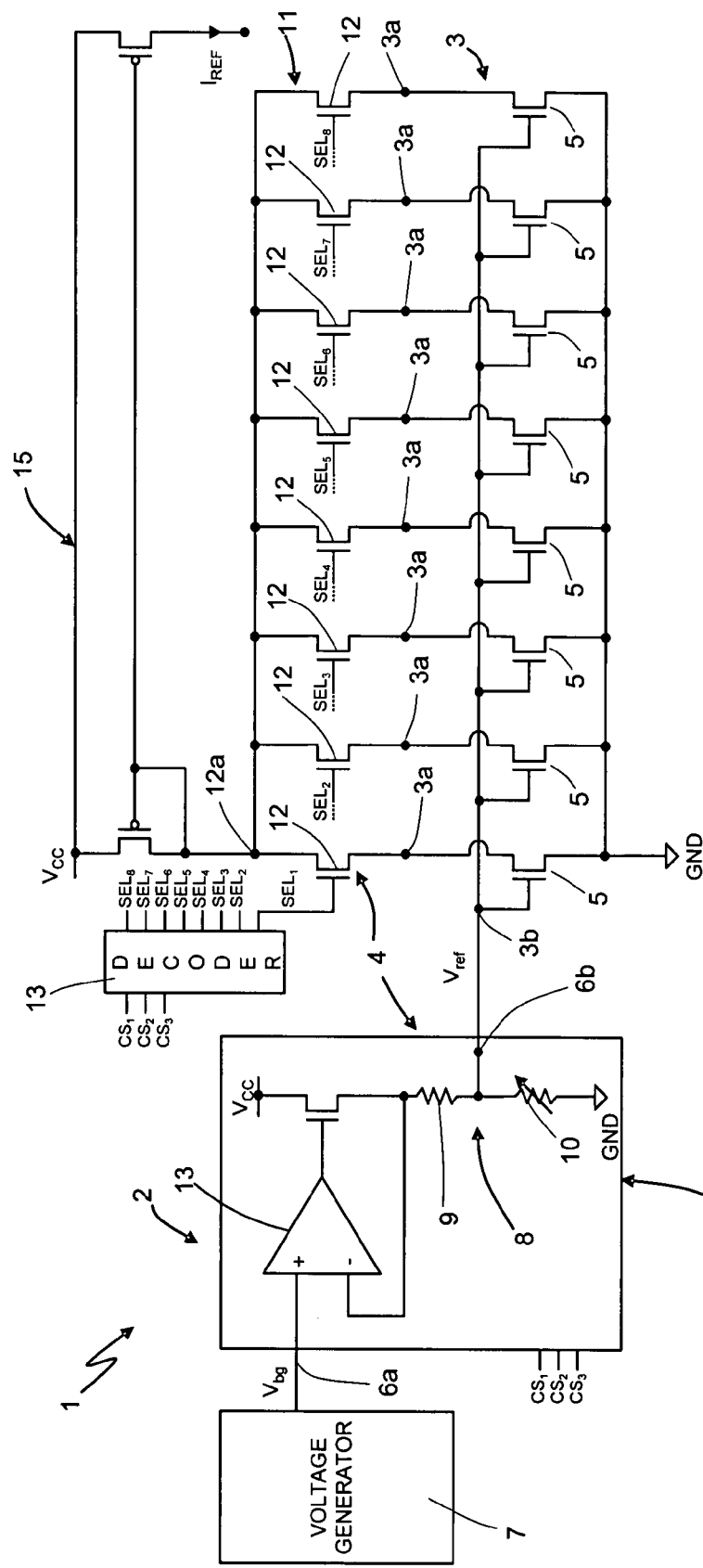
FIG. 2 shows a circuit implementation of the current reference generator of FIG. 1, according to a first embodiment of the present invention.

As shown in FIG. 1, a current reference generator 1, according to an embodiment of the present invention, includes a voltage reference generator stage 2 (e.g. of the bandgap type) configured to generate a reference voltage $V_{ref}$ that is stable with respect to temperature and power supply variations. An output stage 3 includes at least an active element, such as a MOS transistor, coupled to the voltage reference generator stage 2 to receive the reference voltage $V_{ref}$, and to generate at its output a stable reference current $I_{ref}$, as a function of the reference voltage $V_{ref}$.

The current reference generator 1 further comprises a control stage 4, receiving a control signal CS and coupled to the voltage reference generator stage 2 and to the output stage 3, to control, based on the control signal CS (in turn based on the process corner of the manufacturing process), trimmable parameters. The trimmable parameters may include a partition factor determining the value of the reference voltage $V_{ref}$ of the voltage reference generator stage 2, and an aspect ratio of the active element in the output stage 3. The control stage 4 enables a reference current $I_{ref}$ of a desired constant value, being generally stable with respect to temperature and power supply variations, substantially irrespective of process skews.

Using the known expression for the saturation current in a MOS transistor, and considering that the reference voltage $V_{ref}$ drives the gate of the MOS transistor in the output stage 3, the reference current $I_{ref}$, i.e. the saturation current flowing through the MOS transistor, can be expressed as:

$$I_{ref} = \frac{W}{L} \cdot k \cdot (V_{ref} - V_t)^2$$

where W/L is the transistor's aspect ratio, k is the gain factor, and $V_t$ is the transistor's threshold voltage.

The control stage 4 is operable to control, through the partition factor associated with the voltage reference generator stage 2, the value of the reference voltage $V_{ref}$ so that the MOS transistor is biased at its zero TC condition, compensating for changes in the value of the threshold voltage $V_t$ due to the process corner. In other words, the value of the reference voltage $V_{ref}$ is chosen so as to make flat the current sensitivity with temperature, i.e. so as to satisfy the expression dI/dt=0:

$$\frac{W}{L} \cdot \frac{dk}{dt} \cdot (V_{ref} - V_t)^2 + 2 \cdot \frac{W}{L} \cdot k \cdot (V_{ref} - V_t) \cdot \frac{d(V_{ref} - V_t)}{dt} = 0$$

In particular, for a given process corner (i.e. for a given value of the threshold voltage $V_t$ and gain factor k), the value of the flat point does not depend on the aspect ratio W/L of the output MOS transistor.

Since the value of the generated reference current $I_{ref}$ would change from a desired value (corresponding to a target manufacturing process) due to the new value of the reference voltage $V_{ref}$, the control stage 4 is further operable to control the output stage 3, and in particular to trim the aspect ratio W/L associated thereto, based on the determined value of the reference voltage $V_{ref}$, and again on the parameter changes due to the process corner. It is thus possible to provide the desired value of the reference current $I_{ref}$ (e.g. equal to 4 µA), compensating for changes in the electrical parameters, and in particular changes in the value of the gain factor k, due to the process corner. In particular, the aspect ratio W/L is determined as:

$$\frac{W}{L} = \frac{I_{ref}}{k \cdot (V_{ref} - V_t)^2}$$

Accordingly, the control stage 4, based on the control signal CS (which in turn is dependent on the process corner), controls (1) the value of the generated reference voltage $V_{ref}$ (via the associated partition factor), in order to compensate for the change of the threshold voltage $V_t$ due to process variations and to bias the MOS transistor at its zero TC point, and (2) at the same time, the value of the aspect ratio W/L, in order to compensate for the new value of the reference voltage $V_{ref}$ and the change of the gain factor k, so giving a generally stable reference current $I_{ref}$. In particular, the value of the $V_{ref}$ partition is related to the value of the aspect ratio W/L through the above expressions, and both values are controlled jointly according to the process corner. Indeed, a given process corner resulting from the manufacturing process (and so to given $V_t$ and k values), are uniquely associated: a proper value of the $V_{ref}$ partition making flat the dI/dT expression; and a related value of the aspect ratio W/L keeping the $I_{ref}$ value constant to the desired value.

FIG. 2 shows one embodiment of a circuit implementation of the current reference generator 1. The output stage 3 may include an array of active elements 5, for example nMOS transistors, connected between a reference potential (e.g. ground) and a respective selection input terminal 3a which is in turn connected to the control stage 4, through driving input terminal 3b. In one embodiment, the active elements 5 all have different aspect ratios W/L (for example, they have a same channel length L and different channel widths W).

The voltage reference generator stage 2 may include a voltage generator 7 (e.g. a bandgap voltage generator) generating a band-gap voltage $V_{bg}$, based on the bandgap of silicon.

The control stage 4 may also include a partition block 6, interposed between the voltage generator 7 and the driving input terminal 3b of the output stage 3, having an input 6a receiving the generated band-gap voltage $V_{bg}$ and an output 6b outputting to the control terminals of the active elements 5 a generated reference voltage $V_{ref}$ as a partition of the band-gap voltage $V_{bg}$:

$$V_{ref} = m \cdot V_{bg}$$

m being the partition factor (m<1).

The partition block 6 may include, in one embodiment, a resistive voltage divider 8 formed by a fixed resistor 9, connected to the input 6a via a driving operational amplifier 13 in voltage follower configuration, and to the output 6b, and a controlled variable resistor 10 connected between the output 6b and ground. The value of the controlled variable resistor 10 is controlled by the control signal CS, which in this particular case is a digital signal having three control bits $CS_1, CS_2, CS_3$. Accordingly, eight possible values for the controlled variable resistor 10, the partition factor m and, as a result, the reference voltage $V_{ref}$ can be generated in one embodiment of the partition block 6.

The control stage 4 further comprises a selection stage 11 connected to the output stage 3, and including a plurality of active switches 12, e.g. MOS transistors, connected between a common supply terminal 12a and a respective selection input terminal 3a of the output stage 3 (and to a corresponding respective active element 5). The gates 12 have control terminals to receive a respective selection signal $Sel_i$. The number of active switches 12 and associated active elements 5 in the output stage 3 may correspond to the number of possible values of the reference voltage $V_{ref}$. So, in the embodiment, eight active switches 12 and eight corresponding active elements 5 are provided).

The selection signals $Sel_i$ have a low or a high value (and the corresponding active switch 12 is open or closed), according to the value of the control signal CS. In particular, a decoder 13 can be provided, having a number of inputs (in this case three) receiving the control bits $CS_1, CS_2, CS_3$ and a number of outputs (in this case eight) supplying the selection signals $Sel_1$-$Sel_8$ to the active switches 12; to each combination of the control bits $CS_i$ corresponding a high value of one among the selection signals $Sel_i$.

The current reference generator 1 further comprises a current mirror stage 15, connected to the common supply terminal 12a. The current mirror stage 15 mirrors the saturation current flowing in the selected active element 5 and generates at the output of the current reference generator 1 the desired reference current $I_{ref}$.

In particular, each of the possible values of the control signal CS (or combination of control bits $CS_1$-$CS_3$) corresponds to a given process corner; for example, a slow process corner may correspond to a "000" control signal, or a fast process corner to a "111" control signal. In turn, each value of the control signal CS controls the control stage 4, and in particular selects those values of the partition factor m and the associated aspect ratio W/L that compensate for the parameter variations due to that given process corner.

The values of the partition factor m (and of the fixed and variable resistors 9, 10) and the associated aspect ratio W/L are determined from experimental tests, and in particular based on the experimental determination of the trend of the threshold voltage $V_t$ and gain factor k with respect to the various process corners (fast, slow, typical, or a given number of intermediate process corners). In practical terms, the possible process variations are reduced to a finite number of states (in the example shown eight), but the more control bits of the control signal CS are used the more precise and stable the reference current $I_{ref}$ will be. The choice of using three control bits is a trade-off between precision and circuit complexity and silicon footprint. Other choices may be made as well.

As shown in FIG. 3a, a method for controlling the current reference generator 1 envisages first, at block 20, the experimental determination (e.g. by means of known EWS—Electrical Wafer Sorting—measures) of the process corner associated to a given manufactured batch, in order to assess the variation of electrical parameters of the active elements 5 of the output stage 3 with respect to an ideal condition. Then, in block 22, according to the determined process corner, a control signal CS which is uniquely associated to that process corner, is supplied to the control stage 4 of the current reference generator 1. The signal CS is used for selecting a suitable partition factor m for the reference voltage $V_{ref}$ and one of the active elements 5 with a suitable aspect ratio W/L (which is related to the selected partition factor m), in order to compensate for process skews. In this manner, variations of the reference current $I_{ref}$ are greatly reduced and its value is kept substantially constant, and also stable in temperature.

A variant of the above control method, shown in FIG. 3b, does not envisage a preliminary experimental determination of the process corner. Instead, the reference current $I_{ref}$ generated by the manufactured reference current generator 1 is first compared, at block 24, to a desired current value (which would be generated in the absence of process skews). Then, at block 26, the value of the control signal CS is modified (among the various available bit configurations) until the reference current $I_{ref}$ becomes equal to (or close to in a given range) the desired current value, as determined at diamond 28.

The control signal CS gives the desired value for the reference current $I_{ref}$ and assures a reasonably flat temperature sensitivity (dI/dt) due to the fact that, according to the described trimming architecture, an automatic and simultaneous compensation of both threshold voltage $V_t$ and gain factor k is assured.

In particular, the described current reference generator can be trimmed both in the value and in the temperature slope of the generated reference current $I_{ref}$, thus generating a constant and stable current reference irrespective of process skews due to manufacturing processes in some embodiments. In fact, the partition factor m, giving the reference voltage $V_{ref}$ for driving the output active element 5 from the stable band-gap voltage $V_{bg}$, and the aspect ratio W/L of the same active element 5 can be trimmed jointly by a same control signal CS, to compensate for both threshold and gain variation due to process skews in some cases.

Turning now to FIG. 4, a portion of an electronic system 30 is shown in which the current reference generator 1 can advantageously be embodied in accordance with an embodiment of the present invention. Electronic system 30 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. Electronic system 30 may be used in any of the following systems: a wireless local area network (WLAN) system, a wireless personal area network (WPAN) system, a cellular network, although the scope of the present invention is not limited in this respect.

Electronic system 30 includes a controller 31, an input/output (I/O) device 32 (e.g. a keypad, display), static random access memory (SRAM) 33, a memory 34, and a wireless interface 35 coupled to each other via a bus 36. A battery 37 and a camera 38 may be present in some embodiments. It should be noted that the scope of the present invention is not limited to embodiments having any or all of these components.

Controller 31 comprises, for example, one or more microprocessors, digital signal processors, microcontrollers, or the like.

Memory 34 may be used to store messages transmitted to or by the electronic system 30, and may also optionally be used to store instructions that are executed by controller 31 during operation, and to store user data.

Memory 34 may be provided by one or more different types of memory. In the illustrated embodiment, memory 34 comprises an array 38 of phase change memory cells. A current reference generator 1 is electrically connected to the array 38 for supplying the reference current $I_{ref}$ to the phase change memory cells during memory operations (like reading, or programming). A control unit 39 is electrically connected to the current reference generator 1 to supply the control signal CS for controlling trimming operations against process skews. Memory 34 may comprise however other types of non-volatile random access memories, such as a flash memory.

Input/output device 32 may be used by a user to generate a message. Electronic system 30 uses wireless interface 35 to transmit and receive messages to and from a wireless communication network with a radio frequency (RF) signal. Examples of wireless interface 35 may include an antenna or a wireless transceiver, although the scope of the present invention is not limited in this respect.

Finally, it is clear that numerous variations and modifications may be made to what described and illustrated herein, all falling within the scope of the invention as defined in the attached claims.

In particular, the control signal CS may have a different number of control bits, to achieve a different trade-off between precision and area occupation (a greater number of bits allowing to better follow the process variations, at the expense of a greater area occupation).

Figure 5:
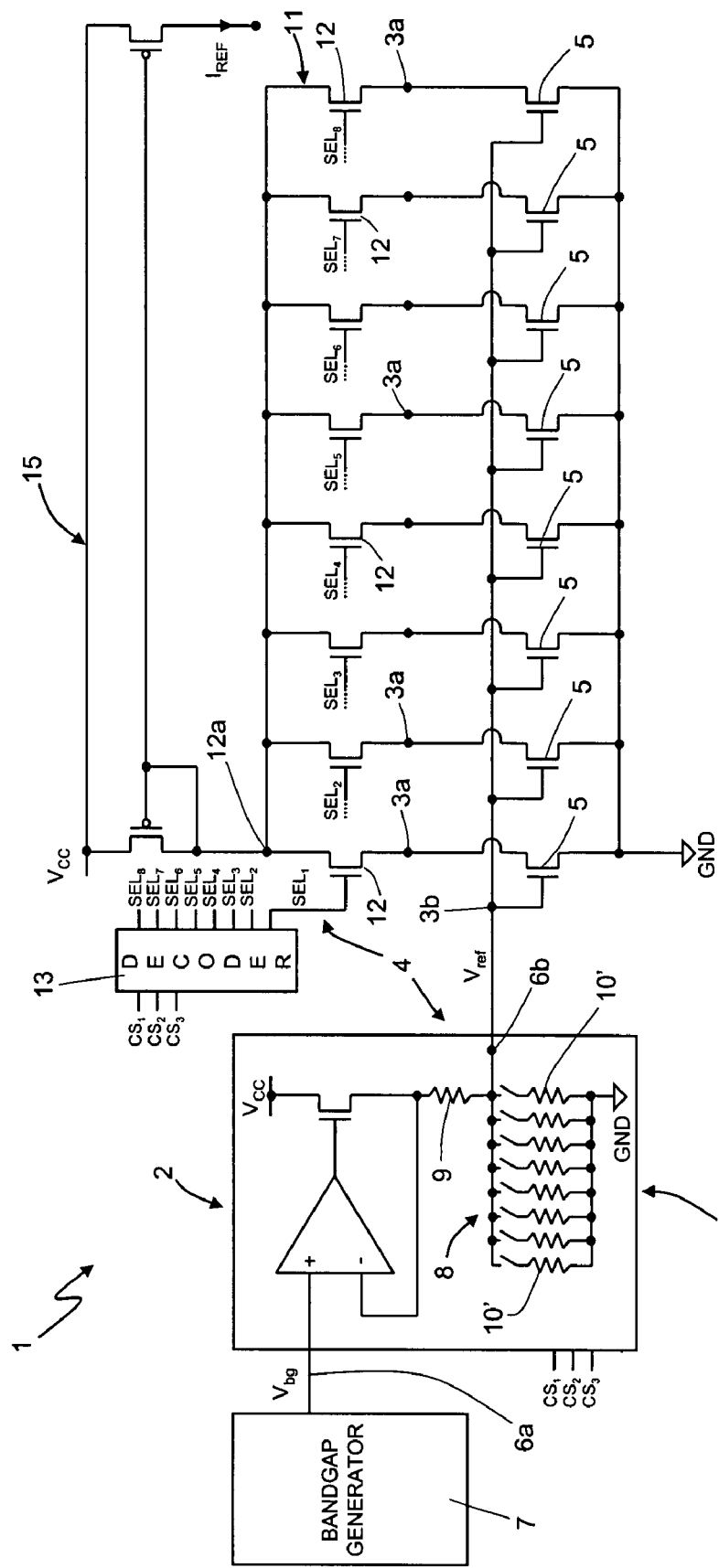
FIG. 5 shows a circuit implementation of the current reference generator of FIG. 1, according to a second embodiment of the present invention.

Other circuit arrangements could be envisaged in the reference current generator 1. For example, as shown in FIG. 5, the use of an array of parallel connected second resistors 10' instead of a single controlled variable resistor 10 could be envisaged to modify the partition factor m, the control signal CS in this case selecting also the particular second resistor (or resistors) 10' to be used in the voltage divider to output the desired current (e.g. via respective active switches similarly to what is described for the selection of the active elements 5).

The control signal CS could activate simultaneously more than one of the active switches 12, and the current mirror stage 15, outputting the reference current $I_{ref}$, mirror in this case is the sum of the saturation currents flowing through the corresponding active elements 5 of the output stage 3.

Moreover, other types of voltage reference generator could be used, different from the band-gap generator, to generate a stable voltage reference.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A current reference generator comprising:
   a voltage reference generator stage to generate a reference voltage;
   an active element output stage coupled to receive said reference voltage and output a reference current as a function of said reference voltage; and
   a control stage operatively coupled to said voltage reference generator stage to control a first trimmable parameter associated with said voltage reference generator stage and a second trimmable parameter associated to said active element output stage to compensate for changes in a value of said reference current due to manufacturing process deviations, said control stage to trim said first trimmable parameter to set a temperature coefficient of said active element output stage at a desired value.

2. The generator according to claim 1, wherein said control stage to receive a control signal and to trim respective values of said first trimmable parameter and of said second trimmable parameter based on said control signal.

3. The generator according to claim 2, wherein said control signal is indicative of a manufacturing process deviation with respect to an ideal manufacturing process.

4. The generator according to claim 3, wherein said active element output stage comprises a MOS transistor arrangement, and said control stage comprises a first trimming block to trim said first trimmable parameter, and a second trimming block to trim said second trimmable parameter, in order to compensate for variations in a threshold voltage and in a gain factor, respectively, of said MOS transistor arrangement due to said manufacturing process deviations.

5. The generator according to claim 4, wherein said first trimming block to trim said first trimmable parameter in order to bias said MOS transistor arrangement in a zero temperature coefficient condition, and said second trimming block to trim said second trimmable parameter in order to set a desired value for said reference current.

6. The generator according to claim 4, wherein said MOS transistor arrangement comprises an array of MOS transistors having different aspect ratios.

7. The generator according to claim 6, wherein said voltage reference generator stage comprises a voltage generator to generate a given voltage, said first trimming block comprising a controllable resistive voltage divider electrically connected to said voltage generator to supply, to a common gate terminal of the MOS transistors of said array, said reference voltage as a partition of said given voltage.

8. The generator according to claim 7, said first trimmable parameter being a partition factor of said controllable resistive voltage divider and said second trimming block comprising a plurality of controllable selector elements connecting a respective MOS transistor of said array to an output terminal of said active element output stage to select at least one MOS transistor of said array to output said reference current at said output terminal, said second trimmable parameter being an aspect ratio of said MOS transistor arrangement.

9. The generator according to claim 8, wherein said control stage to receive a control signal that is in combination of a value of said partition factor and an associated value of said aspect ratio, such that said reference current has reduced variations with said manufacturing process deviations.

10. The generator according to claim 1, said active element output stage including a plurality of selectable transistors with difference aspect ratios.

11. A non-volatile memory comprising:
an array of memory cells; and
a current reference generator device to supply a reference current to said array of memory cells, said generator including:
a voltage reference generator stage to generate a reference voltage;
an active element output stage coupled to receive said reference voltage and output said reference current as a function of said reference voltage; and
a control stage operatively coupled to said voltage reference generator stage to control a first trimmable parameter associated with said voltage reference generator stage and a second trimmable parameter associated to said active element output stage to compensate for changes in a value of said reference current due to manufacturing process deviations, said control stage to trim said first trimmable parameter to set a temperature coefficient of said active element output stage at a desired value.

12. The memory according to claim 11, wherein said array of memory cells includes phase change memory cells.

13. The memory according to claim 11, wherein said control stage to receive a control signal and to trim respective values of said first trimmable parameter and of said second trimmable parameter based on said control signal.

14. The memory according to claim 13, wherein said control signal is indicative of a manufacturing process deviation with respect to an ideal manufacturing process.

15. The memory according to claim 14, wherein said active element output stage comprises a MOS transistor arrangement, and said control stage comprises a first trimming block to trim said first trimmable parameter, and a second trimming block to trim said second trimmable parameter, in order to compensate for variations in a threshold voltage and in a gain factor, respectively, of said MOS transistor arrangement due to said manufacturing process deviations.

16. The memory according to claim 15, wherein said first trimming block to trim said first trimmable parameter in order to bias said MOS transistor arrangement in a zero temperature coefficient condition, and said second trimming block to trim said second trimmable parameter in order to set a desired value for said reference current.

17. The memory according to claim 15, wherein said MOS transistor arrangement comprises an array of MOS transistors having different aspect ratios.

18. The memory according to claim 17, wherein said voltage reference generator stage comprises a voltage generator to generate a given voltage, said first trimming block comprising a controllable resistive voltage divider electrically connected to said voltage generator to supply, to a common gate terminal of the MOS transistors of said array, said reference voltage as a partition of said given voltage.

19. The memory according to claim 18, said first trimmable parameter being a partition factor of said controllable resistive voltage divider and said second trimming block comprising a plurality of controllable selector elements connecting a respective MOS transistor of said array to an output terminal of said active element output stage to select at least one MOS transistor of said array to output said reference current at said output terminal, said second trimmable parameter being an aspect ratio of said MOS transistor arrangement.

20. The memory according to claim 19, wherein said control stage to receive a control signal that is in combination of a value of said partition factor and an associated value of said aspect ratio, such that said reference current has reduced variations with said manufacturing process deviations.

21. The memory according to claim 11, said active element output stage including a plurality of selectable transistors with difference aspect ratios.

22. A method comprising:
controlling a first trimmable parameter associated with a voltage reference generator stage and a second trimmable parameter associated with an active element output stage to compensate for changes in a value of a reference current due to manufacturing process deviations, wherein said voltage reference generator stage outputs a voltage reference, said active element output stage outputs said reference current as a function of said voltage reference, and said controlling to trim said first trimmable parameter to set a temperature coefficient of said active element output state at a desired value.

23. The method according to claim 22, wherein controlling comprises supplying to said current reference generator device a control signal for trimming respective values of said first trimmable parameter and of said second trimmable parameter, said values being related to each other.

24. The method according to claim 23, wherein said trimming respective values of said first and second trimmable parameters comprises compensating for a change in a threshold voltage and in a gain factor, respectively, of a MOS transistor arrangement in said active element output stage due to said manufacturing process deviations.

25. The method according to claim 24, wherein trimming said first trimmable parameter comprises biasing said MOS transistor arrangement in a zero temperature coefficient condition, and trimming said second trimmable parameter comprises setting a desired value for said reference current.

26. The method according to claim 24, wherein trimming comprises selecting at least one MOS transistor of an array of MOS transistors having different aspect ratios to output said reference current.

27. The method according to claim 22, further comprising trimming respective values of said first and second trimmable parameters as a function of a determined deviation from an ideal manufacturing process.

28. The method according to claim 22, further comprising modifying a value of said control signal until said active element output stage supplies a desired value of said reference current.

29. A system comprising:
a processor;
a non-volatile memory coupled to said processor, said memory including an array of memory cells, a current reference generator device to supply a reference current to said array of memory cells, said generator including a voltage reference generator stage to generate a reference voltage, an active element output stage coupled to receive said reference voltage and output said reference current as a function of said reference voltage, and a control stage operatively coupled to said voltage reference generator stage to control a first trimmable parameter associated with said voltage reference generator stage and a second trimmable parameter associated to said active element output stage to compensate for changes in a value of said reference current due to manufacturing process deviations, said control stage to trim said first trimmable parameter to set a temperature coefficient of said active element output stage at a desired value; and
a wireless interface coupled to said processor.

30. The system according to claim 29, wherein said cells are phase change memory cells.

* * * * *